United States Patent
Vaturi

(10) Patent No.: US 10,425,100 B1
(45) Date of Patent: Sep. 24, 2019

(54) CONTINUOUS TIME SIGMA DELTA ANALOG TO DIGITAL CONVERTER

(71) Applicant: Microsoft Technology Licensing, LLC, Redmond, WA (US)

(72) Inventor: Efri Efraim Vaturi, Petach-Tikva (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/164,773

(22) Filed: Oct. 18, 2018

Related U.S. Application Data

(60) Provisional application No. 62/740,939, filed on Oct. 3, 2018.

(51) Int. Cl.
*H03M 3/00* (2006.01)

(52) U.S. Cl.
CPC ............ *H03M 3/464* (2013.01); *H03M 3/43* (2013.01); *H03M 3/438* (2013.01)

(58) Field of Classification Search
CPC ......... H03M 3/464; H03M 3/43; H03M 3/438
USPC .................................................. 341/143–155
See application file for complete search history.

(56) References Cited

U.S. PATENT DOCUMENTS

| | | | |
|---|---|---|---|
| 6,325,341 B1 * | 12/2001 | Brown ................ | B65B 67/1233 248/175 |
| 7,009,541 B1 * | 3/2006 | Nguyen ................ | H03M 3/356 341/120 |
| 7,095,345 B2 | 8/2006 | Nguyen et al. | |
| 7,626,527 B1 | 12/2009 | Wang et al. | |
| 9,065,470 B2 | 6/2015 | Oshita et al. | |
| 9,231,614 B2 | 1/2016 | Silva et al. | |
| 9,335,429 B2 | 5/2016 | Melanson et al. | |
| 9,602,126 B2 | 3/2017 | Schinkel et al. | |
| 2004/0145504 A1 * | 7/2004 | Doerrer ................ | H03M 3/37 341/143 |
| 2005/0116851 A1 * | 6/2005 | Clara ................ | H03M 1/0678 341/144 |

OTHER PUBLICATIONS

Lee, et al., "A Low-Power Incremental Delta-Sigma ADC for CMOS Image Sensors", In Proceedings of IEEE Transactions on Circuits and Systems II: Express Briefs, vol. 63, No. 4, Apr. 1, 2016, pp. 371-375.

Perez, Aldo Pena, "Sigma-Delta (ΣΔ) Modulators Low Power Design Strategies", In Thesis of the University of Pavia, Feb. 11, 2010, 144 Pages.

* cited by examiner

*Primary Examiner* — Lam T Mai

(57) ABSTRACT

A continuous time sigma delta modulator for use in a continuous time sigma delta analog to digital converter is described. The modulator comprises a sequence of integration stages and a quantizer arranged to receive an output from the last integration stage in the sequence. Each integration stage comprises an integrator circuit that in turn comprises an amplifier and the sequence of integration stages comprises a pair of integration stages. The pair of integration stages further comprises a shared current steering DAC and wherein the amplifier in the integrator circuit in a first of the pair of integration stages forms part of a current steering circuit for the second of the pair of integration stages and the amplifier in the integrator circuit in the second of the pair of integration stages forms part of a current steering circuit for the first of the pair of integration stages.

20 Claims, 7 Drawing Sheets

CONTINUOUS TIME SIGMA DELTA ANALOG TO DIGITAL CONVERTER

The present application claims priority to U.S. provisional patent application Ser. No. 62/740,939, filed Oct. 3, 2018, entitled "Continuous Time Sigma Delta Analog to Digital Converter", and hereby incorporated by reference herein in its entirety.

BACKGROUND

There are a number of different types of analog to digital converters (ADC) including switched capacitance sigma delta (SC-SD) ADCs and continuous time sigma delta (CT-SD) ADCs. SC-SD ADCs are more commonly used, however, CT-SD ADCs are becoming more popular due to power and area constraints. CT-SD ADCs are oversampled ADCs that are designed to operate with input signals that have relatively low bandwidth (e.g. 200 kHz). The input signal is sampled within the CT-SD ADC at a frequency that is much higher (e.g. 50-100 times higher) than the signal bandwidth. This has the effect that the transfer function is close to one and the quantization error is shaped such that it is very small within the signal bandwidth but is much larger at higher frequencies. This allows the quantization error to be removed by filtering.

A CT-SD ADC comprises a modulator followed by a decimation filter. The modulator in a single order CT-SD ADC comprises a single integrator stage, but by adding further integrator stages (into the modulator), to produce a higher order CT-SD ADC, the gain can be increased and the quantization noise attenuated further in the signal bandwidth.

The embodiments described below are not limited to implementations which solve any or all of the disadvantages of known CT-SD ADCs.

SUMMARY

The following presents a simplified summary of the disclosure in order to provide a basic understanding to the reader. This summary is not intended to identify key features or essential features of the claimed subject matter nor is it intended to be used to limit the scope of the claimed subject matter. Its sole purpose is to present a selection of concepts disclosed herein in a simplified form as a prelude to the more detailed description that is presented later.

A continuous time sigma delta modulator for use in a continuous time sigma delta analog to digital converter is described. The modulator comprises a sequence of integration stages and a quantizer arranged to receive an output from the last integration stage in the sequence. Each integration stage comprises an integrator circuit that in turn comprises an amplifier and the sequence of integration stages comprises a pair of integration stages. The pair of integration stages further comprises a shared current steering digital to analog converter (DAC) and wherein the amplifier in the integrator circuit in a first of the pair of integration stages forms part of a current steering circuit for the second of the pair of integration stages and the amplifier in the integrator circuit in the second of the pair of integration stages forms part of a current steering circuit for the first of the pair of integration stages.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present examples and is not intended to represent the only forms in which the present example are constructed or utilized. The description sets forth the functions of the example and the sequence of operations for constructing and operating the example. However, the same or equivalent functions and sequences may be accomplished by different examples.

As described above, the modulator in a first order CT-SD ADC comprises a single integrator stage. The modulator in a higher order CT-SD ADC comprises one or more additional integrator stages, such that the modulator in a second order CT-SD ADC comprises two integrator stages, the modulator in a third order CT-SD ADC comprises three integrator stages, etc. Consequently, higher order CT-SD ADCs are larger and consume more power than first order CT-SD ADCs.

Figure 1:
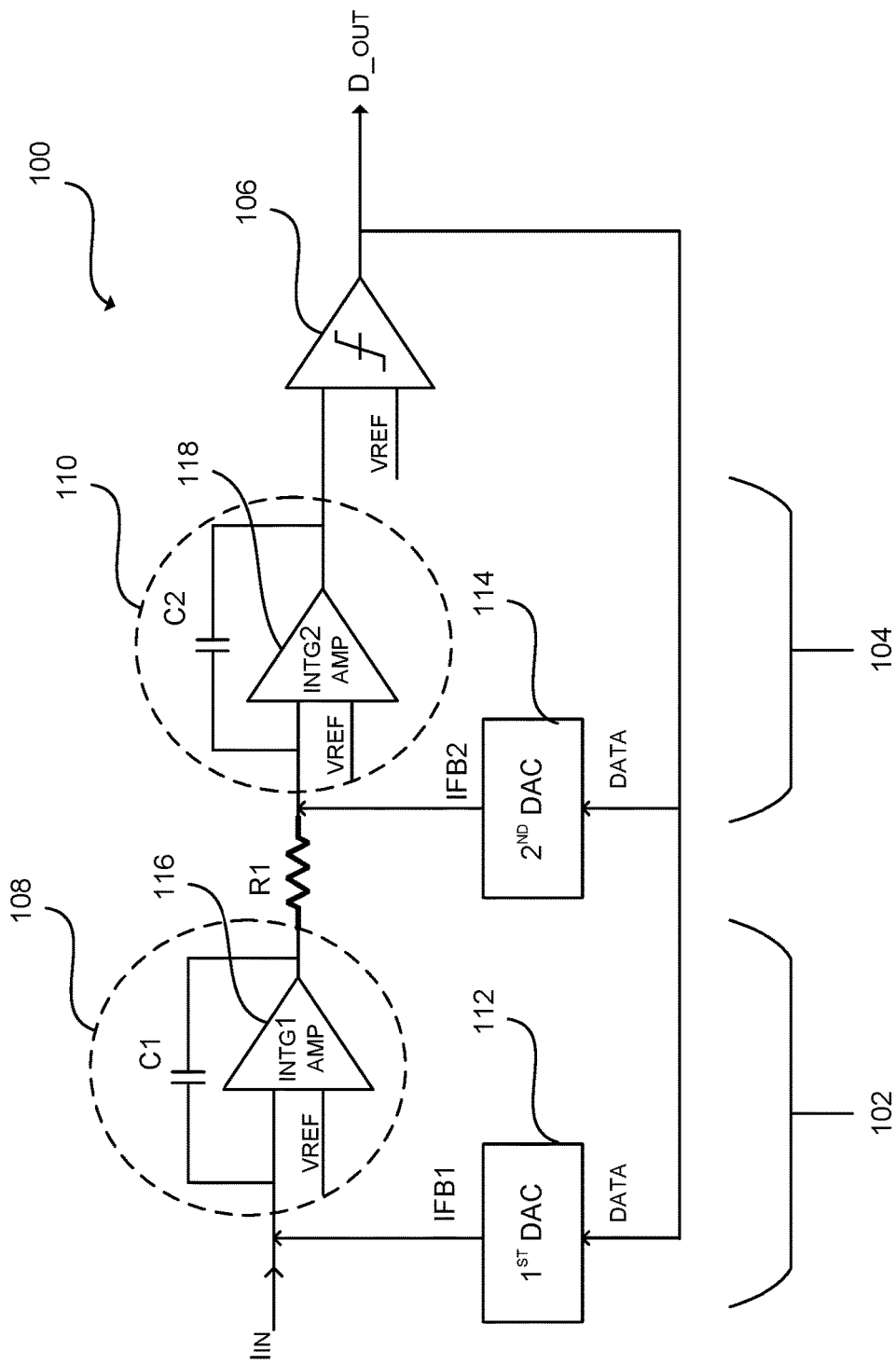
FIG. 1 is a schematic diagram of the modulator in a single ended second order CT-SD ADC.

FIG. 1 is a schematic diagram of the modulator 100 in a single ended second order CT-SD ADC. The modulator 100 comprises a first stage 102, a second stage 104 and a 1-bit quantizer 106. The input signal, $I_{in}$, is input to the first stage 102, the output of the first stage passes through a resistor, R1, and into the second stage 104 and the output of the second stage is input to the quantizer 106. The resistor, R1, affects the current that feeds into the second stage from the output of the first stage. The digital output from the quantiser, D_out, is then input to a decimation block (not shown in FIG. 1) that performs filtering (e.g. to filter out the majority of the quantization noise) and downsampling (as the output signal is at a much higher frequency than the input signal). The output of the decimation filter is the final output of the analog to digital converter.

Each stage 102, 104 in the modulator 100 comprises an integrator circuit 108, 110 and a feedback path from the output of the quantizer 106. Each feedback path comprises a 1-bit digital to analog converter (DAC) 112, 114 and these feedback paths add or subtract voltage/current from the integrator stages according to the quantizer decision. The first integrator circuit 108 integrates the delta (i.e. difference) between the input signal, $I_{in}$, and its feedback, IFB1, and the second integrator circuit 110 integrates the delta between the output signal from the first stage 102 and its feedback IFB2. Each integrator circuit 108, 110 comprises an amplifier 116, 118 (with two inputs and an output) and a capacitor C1, C2. One of the inputs to each amplifier 116, 118 is connected to a reference voltage, vref (e.g. to ground) and the capacitor C1, C2 is connected between the other input and the output of the amplifier.

Inter-symbol interference (ISI) can degrade the performance of the ADC and one of the causes is the feedback not being totally independent of the history (i.e. not totally independent of the data sequence, D_out, output by the quantizer 106). For example, if the feedback is a current of 10 µA, when the feedback data is constantly '1', it will produce exactly 10 µA, but when returning back from a data '0' it will be less than 10 µA (e.g. 9.8 µA). This means that the integration of the data will be dependent upon the number of consecutive ones, e.g. the average of 111000111000 will not be the same as 101010.

Figure 2:
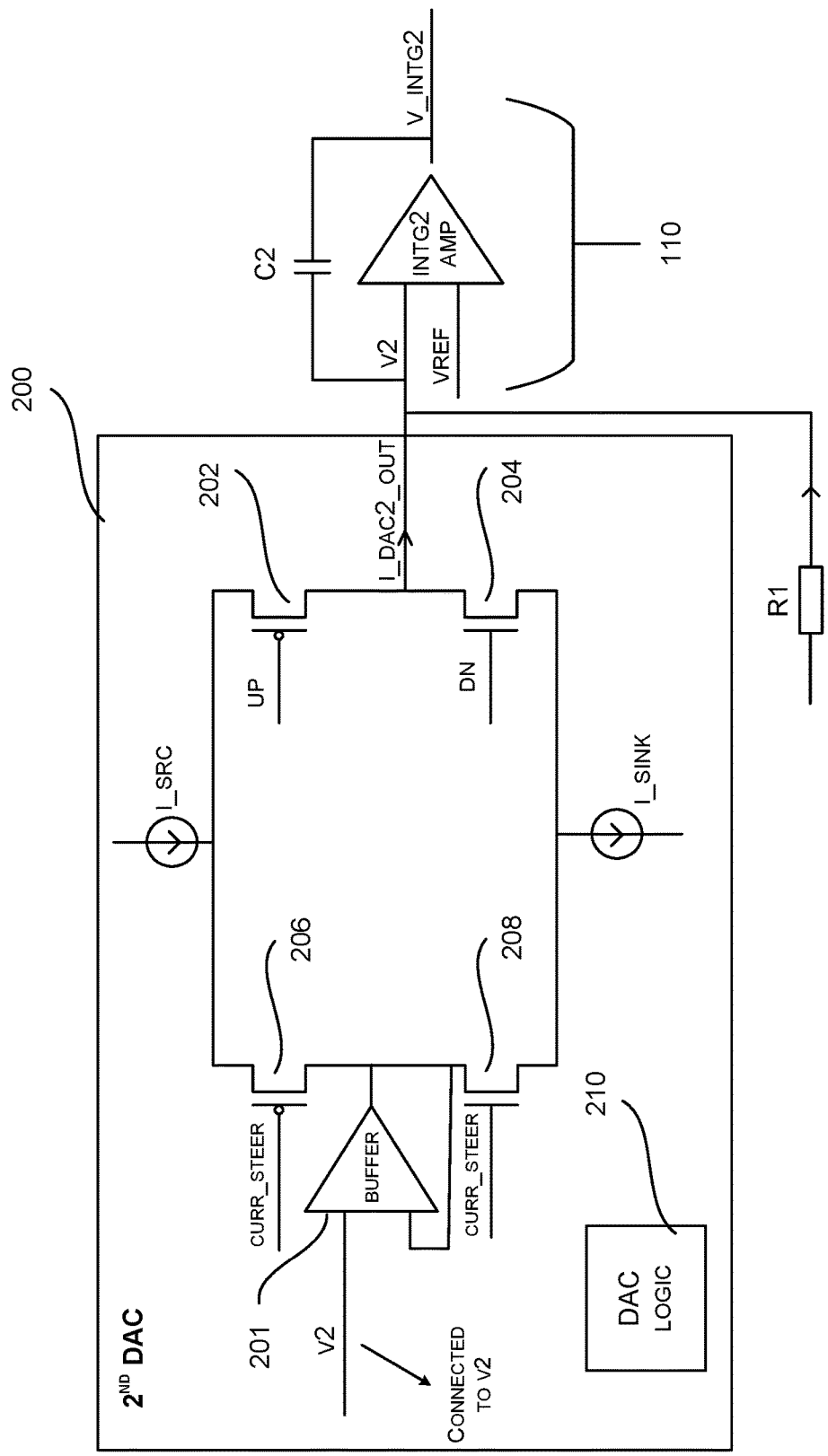
FIG. 2 shows the second stage of the circuit of FIG. 1 and an example internal structure of a DAC that uses current steering.

In order to reduce the ISI, the DACs may use current steering, as shown in FIG. 2. FIG. 2 shows the second stage 104 of the circuit of FIG. 1 and an example internal structure of the 2nd DAC 200 which uses current steering. There are two substantially equal current branches within the DAC 200, a source current, i_src (pushing current from supply) and a substantially equal sink current, i_sink (pulling current to ground) and these two current branches may be generated by a shared current source module (e.g. a shared current source module that generates the source and sink currents for all DACs within the modulator 100), e.g. by mirroring current from a basic current. The term 'substantially equal' is used herein to refer to the fact that whilst the two current branches are generated by a single current source, there may be small differences between the two currents, for example, as a result of mismatch between two transistors generating the current in each current branch. Within the DAC 200, for a feedback signal of data '1', one of the currents (e.g. i_sink) is connected to the integration circuit and for a feedback signal of data '0', the second current (e.g. i_src) is connected to the integration circuit 110. To reduce (and in some examples, to minimize) ISI resulting from the changed current, the currents flow continuously regardless of the data and in the single ended implementation shown in FIG. 2, a buffer connected amplifier 201 conducts the unused current (i.e. i_src for data '1' and i_sink for data '0') while maintaining its output voltage equal to the feedback node (labelled 'v2' in FIG. 2). In this way, each of the current branches conduct their current all the time and see the same voltage. The switching of the currents is implemented by two pairs of switches 202, 204 and 206, 208 and a logic block 210 that generates signals (e.g. 3 signals: up, dn, curr_steer) to control the switches 202-208 (e.g. to toggle the switches) based on the feedback signal.

Figure 3:
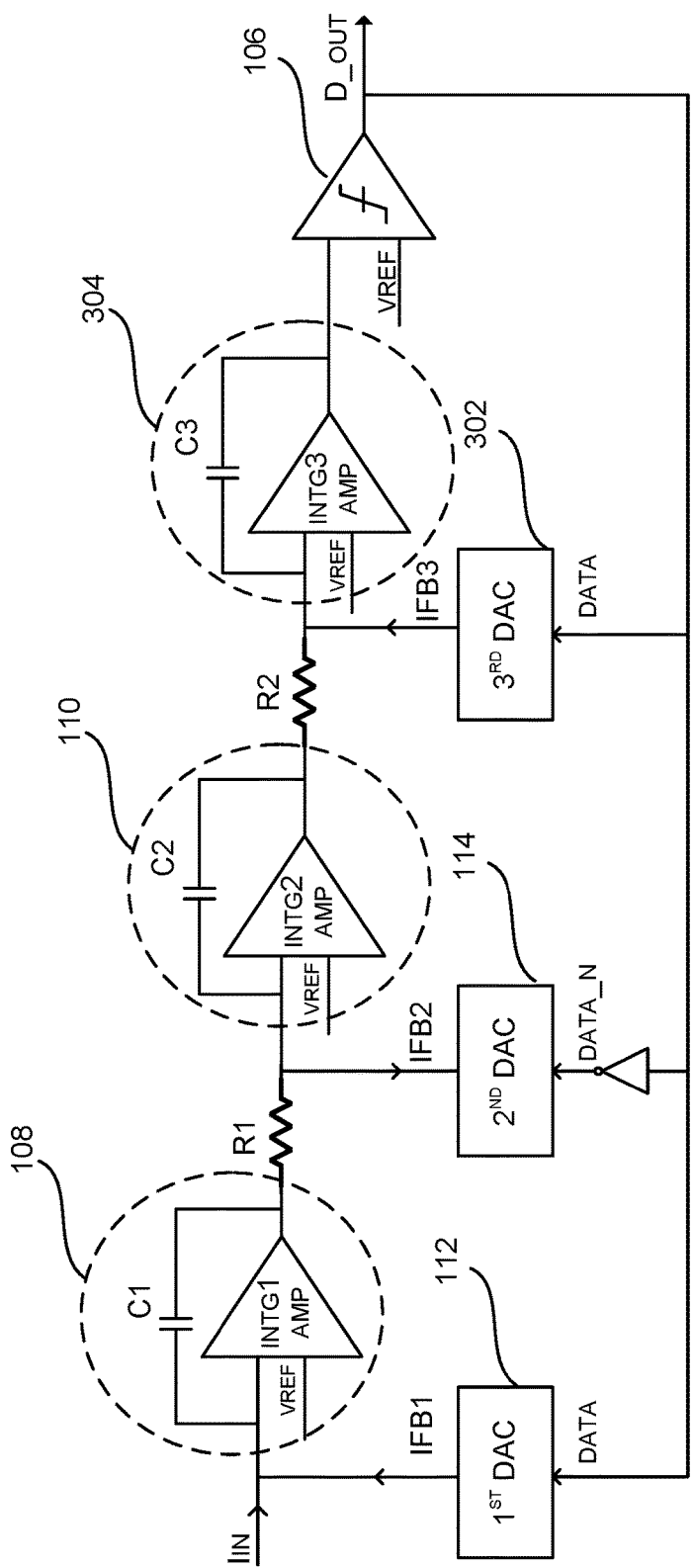
FIG. 3 is a schematic diagram of the modulator in a single ended third order CT-SD ADC.

Based on the architecture of FIG. 2, increasing the order of the ADC from second order (as shown in FIG. 1) to third order (as shown in FIG. 3) would require a significant number of additional components in the modulator (e.g. a 3rd DAC 302 comprising two current branches, a buffer amplifier, four switches, etc. and a third integration circuit 304) and result in a significant increase in the size (i.e. area) and power consumption of the ADC. This increase in size and power consumption may be further exacerbated in implementations that involve use of more than one ADC (e.g. many tens of ADCs) and/or implementations in portable devices where space and power are limited. One such implementation is for touch-screen devices comprising many antennae that are sensing continuously and that include an ADC for each antenna.

Described herein is an improved single ended multi-order CT-SD ADC (e.g. an $n^{th}$ order CT-SD ADC, where n is an integer that is greater than one, and in various examples, n is greater than two). The improved single ended multi-order CT-SD ADC comprises an improved modulator (including a 1-bit quantizer) and a decimation block. As described in detail below, instead of having a feedback path, including a DAC, for each stage (as shown in FIGS. 1 and 3), a pair of adjacent integration stages in the modulator share a modified current steering DAC structure and in particular share the source and sink currents and the corresponding two pairs of switches. The current steering DAC structure does not include a buffer amplifier (in contrast to the DAC 200 shown in FIG. 2), but instead the amplifier in the first of the pair of integration stages (e.g. the amplifier in the $p^{th}$ integration stage, where p is an integer greater than one) functions as the buffer amplifier for the second of the pair of integration stages (e.g. the buffer amplifier for the DAC for the $(p+1)^{th}$ integration stage) and the amplifier in the second of the pair of integration stages (e.g. the amplifier in the $(p+1)^{th}$ integration stage) functions as the buffer amplifier for the first of the pair of integration stages (e.g. the buffer amplifier for the DAC for the $p^{th}$ integration stage). The pair of integration stages that share a current steering DAC structure (e.g. the $p^{th}$ integration stage and the $(p+1)^{th}$ integration stage) may be referred to as a 'linked pair' of integration stages.

By using this shared feedback path and DAC structure without a dedicated buffer amplifier, the benefits of using a higher order CT-SD ADC can be obtained (i.e. increased gain and reduced quantization noise in the signal bandwidth) with only a few additional components (and hence a very small additional area) and little or no increase in power consumption. The power saving, compared to the architecture shown in FIG. 3, is a consequence of saving the static power of the buffer amplifier and the DAC currents as well as the dynamic power of the toggling pairs of switches. Additionally, by reusing existing components, rather than introducing new ones, the risk associated with designing a new circuit and the time taken to design it are reduced.

The feedback path and DAC structure of the disclosure operate in an unconventional manner to achieve a higher order CT-SD ADC that is efficient in terms of number of components and power consumption. The current steering DAC improves the functioning of the underlying device by reducing, in various examples, the ISI and by sharing the DAC structure between two stages of the modulator, the functioning the underlying device is improved by providing increased gain and reduced quantization noise without significantly increasing either the number of components or the power consumption.

Figure 4:
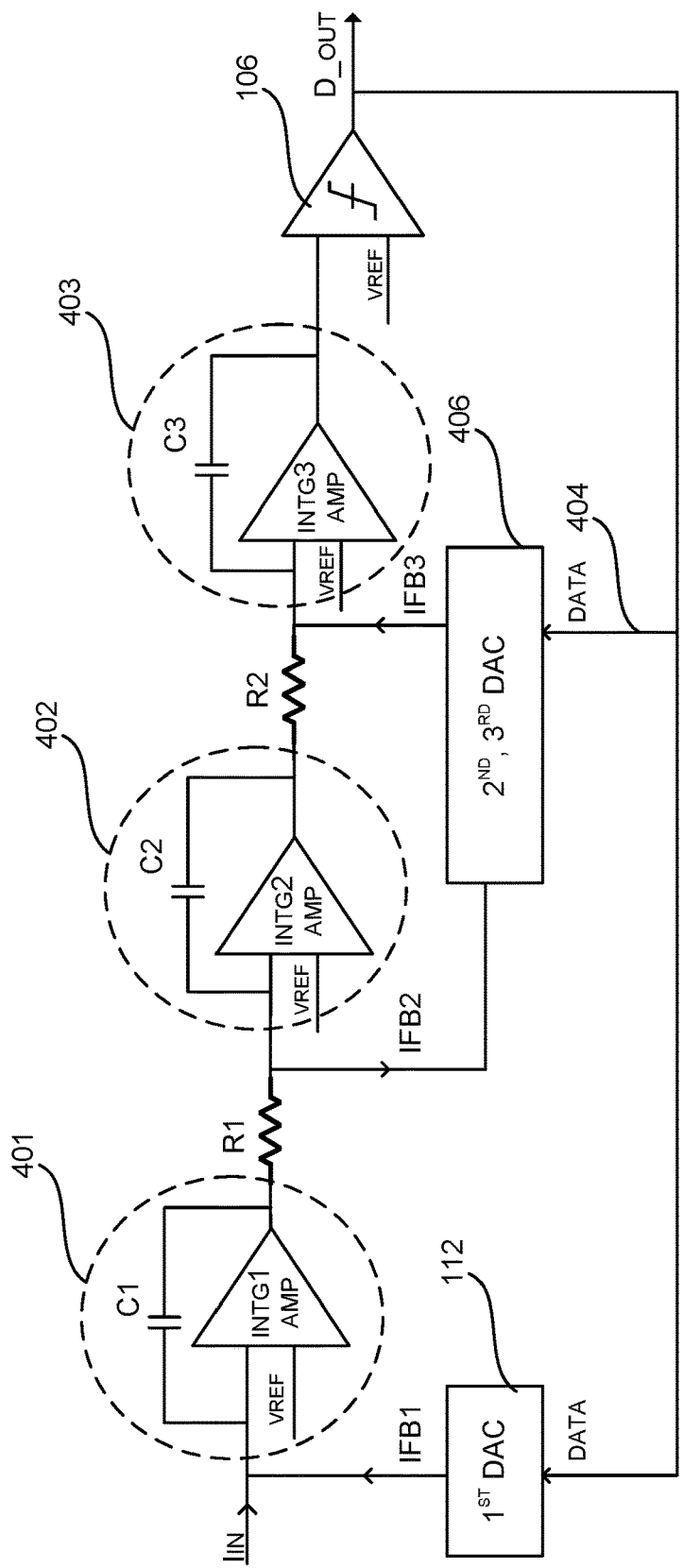
FIG. 4 is a schematic diagram of an example improved modulator in a single ended third order CT-SD ADC.
Figure 5:
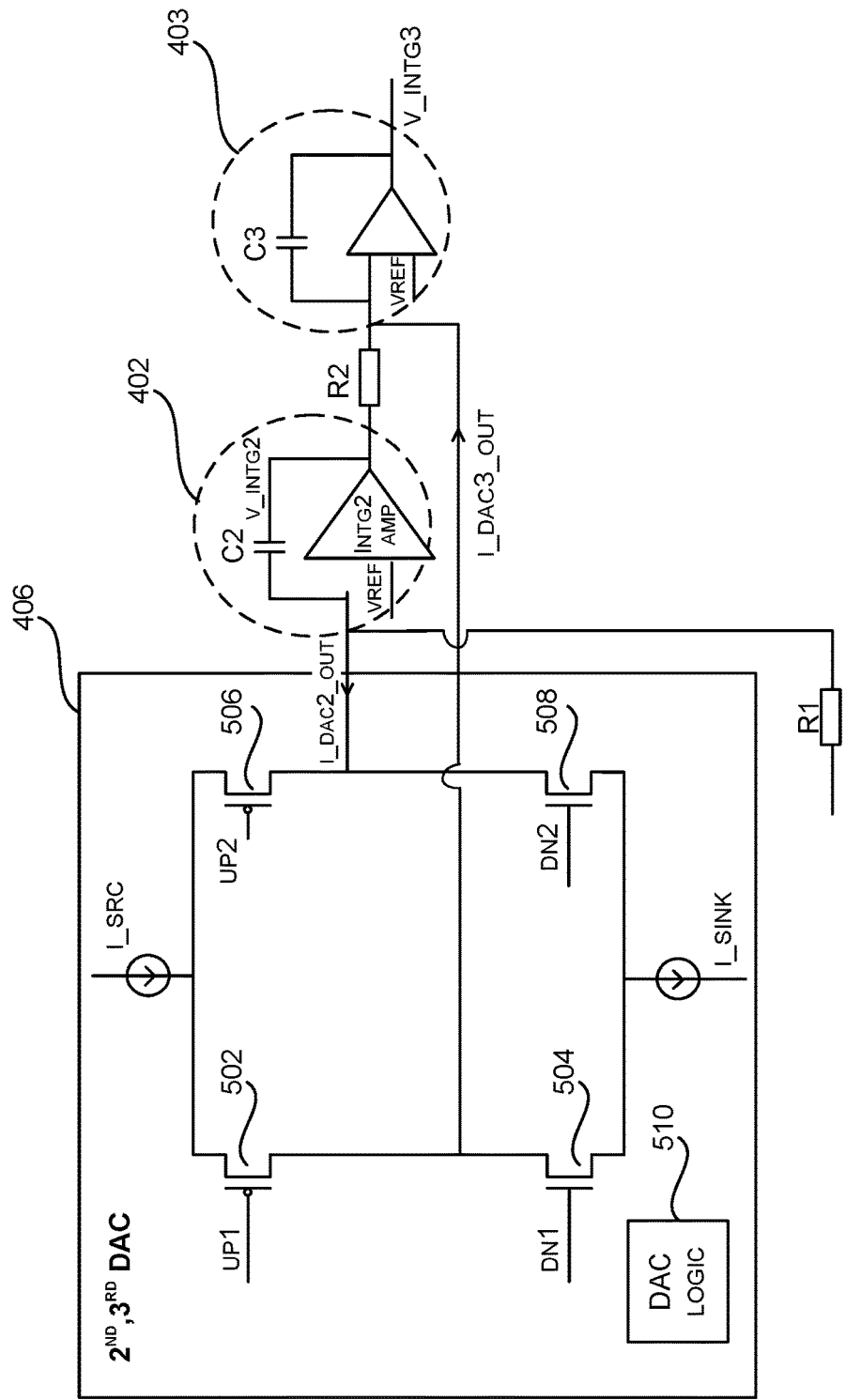
FIG. 5 shows the second and third stages of the circuit of FIG. 4 and an example internal structure of the shared DAC structure.

FIG. 4 is a schematic diagram of an example improved modulator 400 in a single ended third order CT-SD ADC. As this modulator 400 (and hence the ADC) is a third order device, it comprises three integration stages 401-403 and in the example shown the second and third integration stages 402, 403 share a feedback path 404 and DAC structure 406 (i.e. n=3, p=2). The shared DAC structure 406 is shown in detail in FIG. 5. As shown in FIG. 5 and described above, the shared DAC structure 406 does not include a dedicated buffer amplifier to carry the steering current that is not used by an integration stage, but instead the pair of adjacent integration stages operate together such that the amplifier in the integration stage of one of the pair carries the steering current that is not required by the other integration stage and hence acts as the buffer amplifier for that other integration stage, and vice versa. This is possible because the sign of the feedback for the two adjacent integration stages in the modulator is always opposite and hence the current steering in the two integration stages always operates in the opposite way.

The shared DAC structure 406 comprises two pairs of switches 502, 504 and 506, 508 and a logic block 510 that generates the four control signals (up1, dn1, up2, dn2) that operate the switches 502-508 based on the feedback signal received from the output of the quantizer 106. In each pair of switches 502, 504 and 506, 508, there is always one switch that is on and one switch that is off and if in one pair the upper switch is on and the lower switch is off, then in the other pair, the upper switch is off and the lower switch is on. Consequently, the four control signals (up1, dn1, up2, dn2) that are generated by the logic block 510 are correlated, i.e. if the state of one is known then the states of the other three are also known.

In the situation shown by the arrows in FIG. 5, the upper switch 502 in the first pair is on (up1=on) and the lower switch 504 in the first pair is off (dn1=off) and hence current flows from i_src through the upper switch 502 in the first pair and into the third integration stage 403 (comprising amplifier 514). Additionally the upper switch 506 in the second pair is off (up2=off) and the lower switch 508 in the second pair is on (dn2=on) and hence current flows into the shared DAC structure 406, through the lower switch 508 in the second pair and to i_sink.

In the opposite situation to that shown in FIG. 5 (e.g. if the feedback signal received by the shared DAC changes between a zero and a one), the upper switch 502 in the first pair is off (up1=off) and the lower switch 504 in the first pair is on (dn1=on) and hence current flows into the shared DAC structure 406, through the lower switch 504 in the first pair and to i_sink. Additionally the upper switch 506 in the second pair is on (up2=on) and the lower switch 508 in the second pair is off (dn2=off) and hence current flows from i_src through the upper switch 506 in the second pair and into the second integration stage 402 (comprising amplifier 512).

Figure 6:
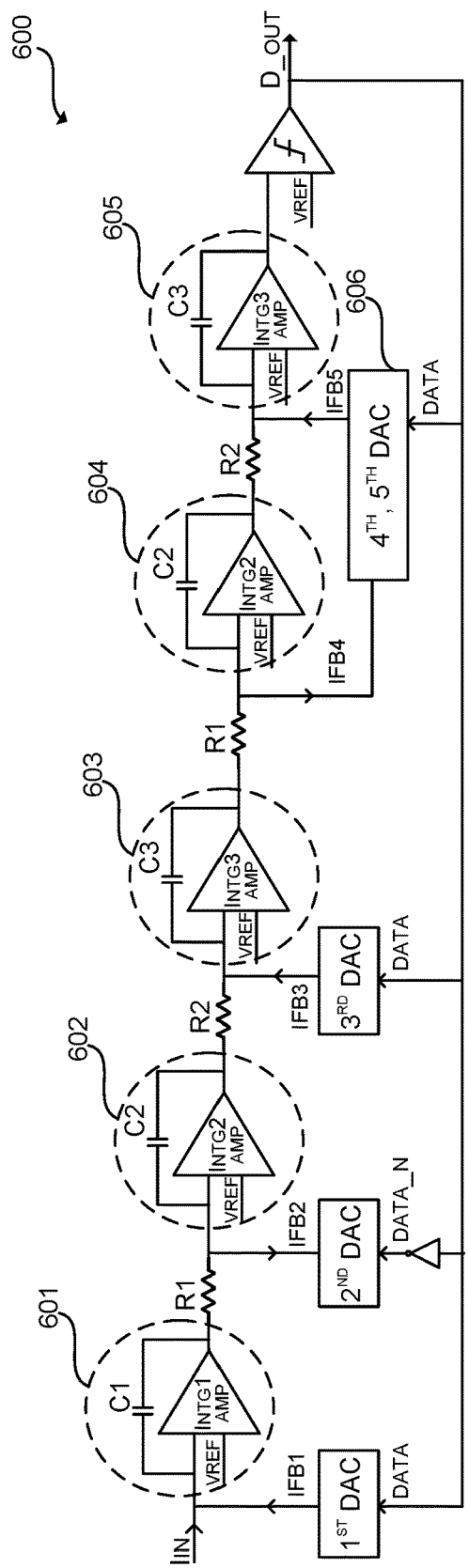
FIG. 6 is a schematic diagram of an example improved modulator in a single ended fifth order CT-SD ADC.
Figure 7:
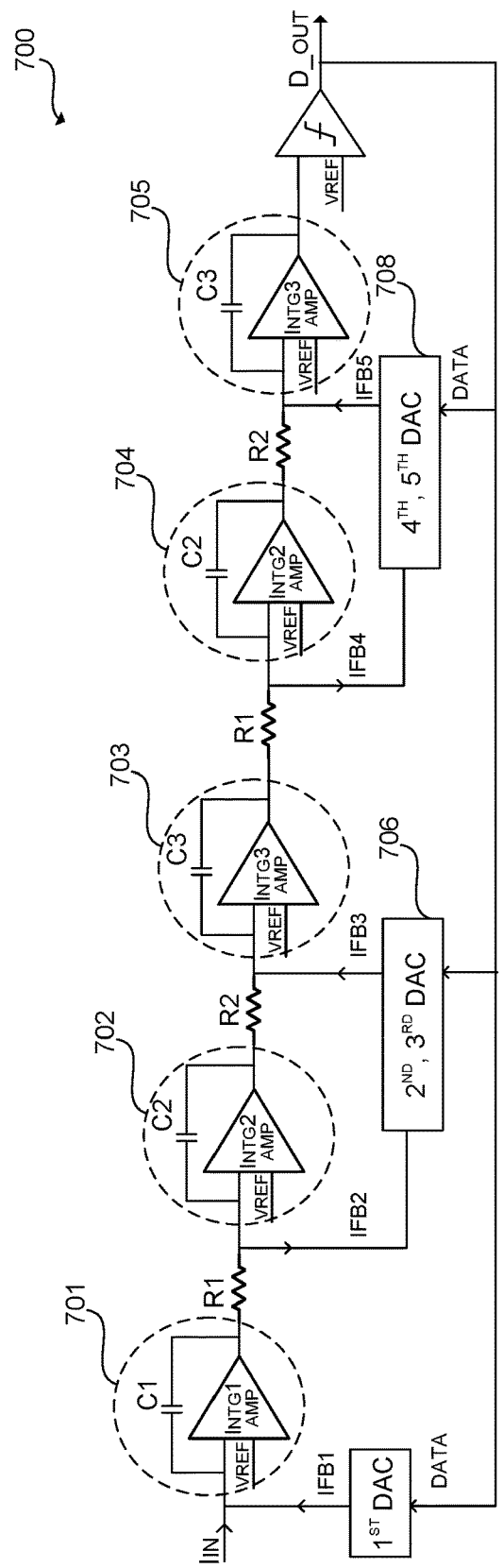
FIG. 7 is a schematic diagram of another example improved modulator in a single ended fifth order CT-SD ADC.

FIGS. 6 and 7 show schematic diagrams of two alternative example improved modulators 600, 700 for a single ended fifth order CT-SD ADCs. In the first example modulator 600 shown in FIG. 6, there is a dedicated feedback path and dedicated DAC for each of the first, second and third integration stages 601-603 and a shared feedback path and shared DAC 606 for the fourth and fifth integration stages 604-605. In contrast, in the second example modulator 700 shown in FIG. 7, there is a dedicated feedback path and dedicated DAC for the first integration stage 701 only and the subsequent integration stages 702-705 are arranged in pairs (702-703 and 704-705) and each pair shares a feedback path and DAC structure 706, 708. Each of the shared DAC structures 606, 706, 708 shown in FIGS. 6 and 7 operates as described above with reference to FIG. 5.

In the examples shown, the shared DAC structure is shared between the second and third stages or between the fourth and fifth stages. It will be appreciated that the structures shown in FIGS. 6 and 7 may be extended to higher order modulators (and hence higher order ADCs), with the shared DAC structure being used for only one pair of stages or for many or all pairs of stages (e.g. for all pairs of stages except the first stage). More generally, the $p^{th}$ integration stage and the $(p+1)^{th}$ integration stage may share a DAC structure where p is an integer and in various examples, p is an integer greater than one and in further examples, p is an even integer greater than one.

In the examples shown in the drawings, the shared DAC structure is not ever shared between the first and second stages, i.e. the first and second integration stages are not linked (i.e. in the examples shown, p>1). This is because the first stage involves higher feedback currents and larger capacitors (e.g. larger values of C1). In order to share a DAC structure between two stages, there is a constraint that the feedback currents must be the same (e.g. IFB2=IFB3 in FIG. 4). In further examples, however, the shared DAC structure may be shared between the first and second stage (e.g. p=1). This requires a larger capacitor C2 in the second stage than if the second stage was not linked to the first stage via a shared DAC structure; however, it enables a second stage to be provided with little additional area or power consumption compared to a first order CT-SD ADC. In all examples, the quantizer 106 is a 1-bit quantizer.

The shared DAC structure and improved CT-SD ADC described herein may be implemented in many devices and for many different applications. In an example, many instances of the improved CT-SD ADC described herein may be implemented in a computing device (e.g. a touch-screen device that is configured to receive both touch input and stylus input) to process signals received from antennae within the touch-screen device, e.g. antennae that are configured to detect signals from a stylus that is proximate to the touch-screen device. In other examples, a single instance of the improved CT-SD ADC described herein may be implemented in a device.

Although the present examples are described and illustrated herein as being implemented in a single ended CT-SD ADC with three or five stages (i.e. in a 3rd order or 5th order single ended CT-SD ADC), the system described is provided as an example and not a limitation. As those skilled in the art will appreciate, the present examples are suitable for application in a variety of different types of single-ended 1-bit multi-order CT-SD ADC. The shared DAC structure described herein may also be used in devices other than a single-ended 1-bit multi-order CT-SD ADC, such as any circuit that uses multi-stages and current steering (e.g. multi-stage amplifier circuits, phase-locked-loop circuits, etc.).

The functionality described herein is performed, at least in part, by one or more hardware logic components. For example, and without limitation, illustrative types of hardware logic components that are optionally used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), Graphics Processing Units (GPUs).

A first further example provides a single-ended multi-order continuous time sigma delta modulator comprising a sequence of integration stages and a 1-bit quantizer arranged to receive an output from the last integration stage in the sequence, wherein each integration stage comprises an integrator circuit comprising an amplifier and the sequence of integration stages comprises a pair of integration stages, wherein the pair of integration stages further comprises a shared current steering DAC configured to receive the digital feedback signal from the output of the quantizer and output analog feedback signals to the integrator circuits in each of the pair of integration stages and wherein the amplifier in the integrator circuit in a first of the pair of integration stages forms part of a current steering circuit for a second of the pair of integration stages and the amplifier in the integrator circuit in the second of the pair of integration stages forms part of a current steering circuit for the first of the pair of integration stages.

A second further example provides a single-ended multi-order continuous time sigma delta modulator for use in a CT-SD ADC, the modulator comprising a sequence of integration stages and a 1-bit quantizer arranged to receive an output from the last integration stage in the sequence, wherein each integration stage comprises an integrator circuit comprising an amplifier and the sequence of integration stages comprises a pair of integration stages, wherein the pair of integration stages further comprises a shared current steering DAC configured to receive the digital feedback signal from the output of the quantizer and output analog feedback signals to the integrator circuits in each of the pair of integration stages and wherein the amplifier in the integrator circuit in a first of the pair of integration stages forms part of a current steering circuit for a second of the pair of integration stages and the amplifier in the integrator circuit in the second of the pair of integration stages forms part of a current steering circuit for the first of the pair of integration stages.

The sequence of integration stages may further comprise, prior to the pair of integration stages: a first integration stage in the sequence further comprising a current steering digital to analog converter (DAC) configured to receive a digital feedback signal from an output of the quantizer and output an analog feedback signal to the integrator circuit in the first integration stage.

The shared current steering DAC may comprise: a first pair of switches and a second pair of switches, each switch within a pair of switches being connected in series and the first and second pairs of switches connected in parallel between two substantially equal current branches; and a logic block arranged to generate control signals for the switches, and wherein an input of the amplifier in the integrator circuit in the first of the pair of integration stages is connected to a point between the two switches in the second pair of switches and an input of the amplifier in the integrator circuit in the second of the pair of integration stages is connected to a point between the two switches in the first pair of switches.

In use, a source current flows from a first current branch in the shared current steering DAC and into the integrator circuit in one of the pair of integration stages and at the same time a sink current flows out of the integrator circuit in another one of the pair of integration stages and into a second current branch in the shared current steering DAC. The source current flowing out of the shared current steering DAC and into the integrator circuit in one of the pair of integration stages may be substantially equal to the sink current flowing out of the integrator circuit in another one of the pair of integration stages and into the shared current steering DAC.

The sequence of integration stages may comprise n integration stages, where n is an integer greater than one and wherein the pair of integration stages comprises an $(n-1)^{th}$ integration stage and an nth integration stage. In various examples, n may be an integer greater than two and in some examples may be an odd integer greater than two. In various examples, n may be greater than four and the sequence of integration stages may further comprise: a second pair of integration stages comprising an $(n-3)^{th}$ integration stage and an $(n-4)^{th}$ integration stage and further comprising a second shared current steering DAC configured to receive the digital feedback signal from the output of the quantizer and output analog feedback signals to the integrator circuits in each of the second pair of integration stages and wherein the amplifier in the integrator circuit in the $(n-4)^{th}$ integration stage forms part of a current steering circuit for the $(n-3)^{th}$ integration stages and the amplifier in the integrator circuit in the $(n-3)^{th}$ integration stage forms part of a current steering circuit for the $(n-4)^{th}$ integration stage.

The modulator may be part of a single-ended continuous time sigma delta analog to digital converter (CT-SD ADC).

A third further example provides a single-ended multi-order continuous time sigma delta analog to digital converter (CT-SD ADC) comprising a sequence of integration stages and a 1-bit quantizer arranged to receive an output from the last integration stage in the sequence, each integration stage comprising an integrator circuit and a feedback path from an output of the quantizer, and wherein the feedback paths of two adjacent integration stages in the sequence of integration stages are linked such that an amplifier in the integrator circuit of a first of the two integration stages forms a part of the current steering circuitry for a second of the two integration stages and an amplifier in the integrator circuit of the second of the two integration stages forms a part of the current steering circuitry for the first of the two subsequent stages.

The sequence of integration stages may further comprise, prior to the two adjacent integration stages: a first integration stage, wherein the feedback path of the first integration stage comprises a current steering DAC.

A fourth further example provides a single-ended multi-order continuous time sigma delta ADC comprising a sequence of integration stages and a 1-bit quantizer arranged to receive an output from the last integration stage in the sequence, wherein each integration stage comprises an integrator circuit comprising an amplifier and the sequence of integration stages comprises a pair of integration stages, wherein the pair of integration stages further comprises a shared current steering DAC configured to receive the digital feedback signal from the output of the quantizer and output analog feedback signals to the integrator circuits in each of the pair of integration stages and wherein the amplifier in the integrator circuit in a first of the pair of integration stages forms part of a current steering circuit for a second of the pair of integration stages and the amplifier in the integrator circuit in the second of the pair of integration stages forms part of a current steering circuit for the first of the pair of integration stages.

The ADC of the third or fourth further example may further comprise a decimation unit arranged to receive an output from the 1-bit quantizer.

The ADC of the third or fourth further example may further comprise any combination of the features of the modulator of the first or second further example, as set out above.

A fifth further example provides method of controlling of a single-ended multi-order continuous time sigma delta modulator comprising a sequence of integration stages and a 1-bit quantizer arranged to receive an output from the last integration stage in the sequence, wherein each integration stage comprises an integrator circuit comprising an amplifier and the sequence of integration stages comprising: a pair of integration stages further comprising a shared current steering digital to analog converter (DAC) configured to receive the digital feedback signal from the output of the quantizer and output analog feedback signals to the integrator circuits in each of the pair of integration stages, the method comprising: based on (or in response to) receiving a first logic level at the shared current steering DAC from the quantizer, generating a first set of control signals, in hardware logic, to steer currents within the shared current steering DAC such that a source current flows from the DAC and into the integrator circuit in a first of the pair of integration stage and a substantially equal sink current flows from the integrator circuit in a second of the pair of integration stages and into the DAC; and based on (or in response to) receiving a second logic level at the shared current steering DAC from the quantizer, generating a second set of control signals, in hardware logic, to steer currents within the shared current steering DAC such that the source current flows from the DAC and into the integrator circuit in the second of the pair of integration stage and a substantially equal sink current flows from the integrator circuit in the first of the pair of integration stages and into the DAC.

The sequence of integration stages may further comprise, prior to the pair of integration stages: a first integration stage in the sequence further comprising a current steering DAC configured to receive a digital feedback signal from an output of the quantizer and output an analog feedback signal to the integrator circuit in the first integration stage.

The shared current steering DAC may comprise a first pair of switches and a second pair of switches, each switch within a pair of switches being connected in series and the first and second pairs of switches connected in parallel between source and sink current branches; and the method may further comprise: based on (or in response to) receiving a first logic level at the shared current steering DAC from the quantizer, providing the first set of control signals to the first and second pairs of switches; and based on (or in response to) receiving a second logic level at the shared current steering DAC from the quantizer, providing the second set of control signals to the first and second pairs of switches.

The sequence of integration stages may comprise n integration stages, where n is an integer greater than one and wherein the pair of integration stages comprises an $(n-1)^{th}$ integration stage and an nth integration stage. In various examples, n may be an integer greater than two and in some examples may be an odd integer greater than two. In various examples, n may be greater than four and the sequence of integration stages may further comprise: a second pair of integration stages comprising an $(n-3)^{th}$ integration stage and an $(n-4)^{th}$ integration stage and further comprising a second shared current steering DAC configured to receive the digital feedback signal from the output of the quantizer and output analog feedback signals to the integrator circuits in each of the second pair of integration stages and wherein the method may further comprise: based on (or in response to) receiving a first logic level at the second shared current steering DAC from the quantizer, generating a third set of control signals, in hardware logic, to steer currents within the second shared current steering DAC such that a source current flows from the DAC and into the integrator circuit in the $(n-3)^{th}$ integration stage and a substantially equal sink current flows from the integrator circuit in the $(n-4)^{th}$ integration stage and into the DAC; and based on (or in response to) receiving a second logic level at the second shared current steering DAC from the quantizer, generating a fourth set of control signals, in hardware logic, to steer currents within the shared current steering DAC such that the source current flows from the DAC and into the integrator circuit in the $(n-4)^{th}$ integration stage and a substantially equal sink current flows from the integrator circuit in the $(n-3)^{th}$ integration stage and into the DAC.

The method may form part of a method of controlling of a single-ended continuous time sigma delta analog to digital converter.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The operations of the methods described herein may be carried out in any suitable order, or simultaneously where appropriate. Additionally, individual blocks may be deleted from any of the methods without departing from the scope of the subject matter described herein. Aspects of any of the examples described above may be combined with aspects of any of the other examples described to form further examples without losing the effect sought.

The term 'comprising' is used herein to mean including the method blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the scope of this specification.

The invention claimed is:

1. A single-ended continuous time sigma delta modulator comprising a sequence of integration stages and a 1-bit quantizer arranged to receive an output from the last integration stage in the sequence,
    wherein each integration stage comprises an integrator circuit comprising an amplifier and the sequence of integration stages comprises a pair of integration stages,
    wherein the pair of integration stages further comprises a shared current steering DAC configured to receive the digital feedback signal from the output of the quantizer and output analog feedback signals to the integrator circuits in each of the pair of integration stages and wherein the amplifier in the integrator circuit in a first of the pair of integration stages forms part of a current steering circuit for a second of the pair of integration stages and the amplifier in the integrator circuit in the second of the pair of integration stages forms part of a current steering circuit for the first of the pair of integration stages.

2. The modulator according to claim 1, wherein the sequence of integration stages further comprises, prior to the pair of integration stages:
    a first integration stage in the sequence further comprising a current steering digital to analog converter (DAC) configured to receive a digital feedback signal from an output of the quantizer and output an analog feedback signal to the integrator circuit in the first integration stage.

3. The modulator according to claim 1, wherein the shared current steering DAC comprises:
   a first pair of switches and a second pair of switches, each switch within a pair of switches being connected in series and the first and second pairs of switches connected in parallel between two substantially equal current branches; and
   a logic block arranged to generate control signals for the switches,
   and wherein an input of the amplifier in the integrator circuit in the first of the pair of integration stages is connected to a point between the two switches in the second pair of switches and an input of the amplifier in the integrator circuit in the second of the pair of integration stages is connected to a point between the two switches in the first pair of switches.

4. The modulator according to claim 1, wherein, in use, a source current flows from a first current branch in the shared current steering DAC and into the integrator circuit in one of the pair of integration stages and at the same time a sink current flows out of the integrator circuit in another one of the pair of integration stages and into a second current branch in the shared current steering DAC.

5. The modulator according to claim 4, wherein the source current flowing out of the shared current steering DAC and into the integrator circuit in one of the pair of integration stages is substantially equal to the sink current flowing out of the integrator circuit in another one of the pair of integration stages and into the shared current steering DAC.

6. The modulator according to claim 1, wherein the sequence of integration stages comprises n integration stages, where n is an integer greater than one and wherein the pair of integration stages comprises an $(n-1)^{th}$ integration stage and an $n^{th}$ integration stage.

7. The modulator according to claim 6, wherein n is an integer greater than two.

8. The modulator according to claim 6, wherein n is an odd integer greater than two.

9. The modulator according to claim 6, wherein n is greater than four and the sequence of integration stages further comprises:
   a second pair of integration stages comprising an $(n-3)^{th}$ integration stage and an $(n-4)^{th}$ integration stage and further comprising a second shared current steering DAC configured to receive the digital feedback signal from the output of the quantizer and output analog feedback signals to the integrator circuits in each of the second pair of integration stages and wherein the amplifier in the integrator circuit in the $(n-4)^{th}$ integration stage forms part of a current steering circuit for the $(n-3)^{th}$ integration stages and the amplifier in the integrator circuit in the $(n-3)^{th}$ integration stage forms part of a current steering circuit for the $(n-4)^{th}$ integration stage.

10. The modulator according to claim 1, wherein the modulator is part of a single-ended continuous time sigma delta analog to digital converter (CT-SD ADC).

11. A single-ended continuous time sigma delta analog to digital converter (CT-SD ADC) comprising a sequence of integration stages and a 1-bit quantizer arranged to receive an output from the last integration stage in the sequence,
   each integration stage comprising an integrator circuit and a feedback path from an output of the quantizer, and wherein the feedback paths of two adjacent integration stages in the sequence of integration stages are linked such that an amplifier in the integrator circuit of a first of the two integration stages forms a part of the current steering circuitry for a second of the two integration stages and an amplifier in the integrator circuit of the second of the two integration stages forms a part of the current steering circuitry for the first of the two subsequent stages.

12. The analog to digital converter according to claim 11, wherein the sequence of integration stages further comprises, prior to the two adjacent integration stages:
   a first integration stage, wherein the feedback path of the first integration stage comprises a current steering DAC.

13. A method of controlling of a single-ended continuous time sigma delta modulator comprising a sequence of integration stages and a 1-bit quantizer arranged to receive an output from the last integration stage in the sequence,
   wherein each integration stage comprises an integrator circuit comprising an amplifier and the sequence of integration stages comprising:
      a pair of integration stages further comprising a shared current steering digital to analog converter (DAC) configured to receive the digital feedback signal from the output of the quantizer and output analog feedback signals to the integrator circuits in each of the pair of integration stages,
   the method comprising:
      based on receiving a first logic level at the shared current steering DAC from the quantizer, generating a first set of control signals, in hardware logic, to steer currents within the shared current steering DAC such that a source current flows from the DAC and into the integrator circuit in a first of the pair of integration stage and a substantially equal sink current flows from the integrator circuit in a second of the pair of integration stages and into the DAC; and
      based on receiving a second logic level at the shared current steering DAC from the quantizer, generating a second set of control signals, in hardware logic, to steer currents within the shared current steering DAC such that the source current flows from the DAC and into the integrator circuit in the second of the pair of integration stage and a substantially equal sink current flows from the integrator circuit in the first of the pair of integration stages and into the DAC.

14. The method according to claim 13, wherein the sequence of integration stages further comprises, prior to the pair of integration stages:
   a first integration stage in the sequence further comprising a current steering DAC configured to receive a digital feedback signal from an output of the quantizer and output an analog feedback signal to the integrator circuit in the first integration stage.

15. The method according to claim 13, wherein the shared current steering DAC comprises a first pair of switches and a second pair of switches, each switch within a pair of switches being connected in series and the first and second pairs of switches connected in parallel between source and sink current branches; and the method further comprises:
   based on receiving a first logic level at the shared current steering DAC from the quantizer, providing the first set of control signals to the first and second pairs of switches; and based on receiving a second logic level at the shared current steering DAC from the quantizer, providing the second set of control signals to the first and second pairs of switches.

16. The method according to claim 13, wherein the sequence of integration stages comprises n integration stages, where n is an integer greater than one and wherein the pair of integration stages comprises an $(n-1)^{th}$ integration stage and an $n^{th}$ integration stage.

17. The method according to claim 16, wherein n is an integer greater than two.

18. The method according to claim 16, wherein n is an odd integer greater than two.

19. The method according to claim 16, wherein n is greater than four and the sequence of integration stages further comprises:

a second pair of integration stages comprising an $(n-3)^{th}$ integration stage and an $(n-4)^{th}$ integration stage and further comprising a second shared current steering DAC configured to receive the digital feedback signal from the output of the quantizer and output analog feedback signals to the integrator circuits in each of the second pair of integration stages and wherein the method further comprises:

based on receiving a first logic level at the second shared current steering DAC from the quantizer, generating a third set of control signals, in hardware logic, to steer currents within the second shared current steering DAC such that a source current flows from the DAC and into the integrator circuit in the $(n-3)^{th}$ integration stage and a substantially equal sink current flows from the integrator circuit in the $(n-4)^{th}$ integration stage and into the DAC; and based on receiving a second logic level at the second shared current steering DAC from the quantizer, generating a fourth set of control signals, in hardware logic, to steer currents within the shared current steering DAC such that the source current flows from the DAC and into the integrator circuit in the $(n-4)^{th}$ integration stage and a substantially equal sink current flows from the integrator circuit in the $(n-3)^{th}$ integration stage and into the DAC.

20. The method according to claim 13, wherein the method forms part of a method of controlling of a single-ended continuous time sigma delta analog to digital converter.

* * * * *